US009269579B2

(12) United States Patent
Kinoshita et al.

(10) Patent No.: US 9,269,579 B2
(45) Date of Patent: Feb. 23, 2016

(54) METHOD FOR MANUFACTURING SILICON CARBIDE SEMICONDUCTOR DEVICE

(75) Inventors: Akimasa Kinoshita, Tsukuba (JP); Takashi Tsuji, Tsukuba (JP); Fumikazu Imai, Tsukuba (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 123 days.

(21) Appl. No.: 14/110,143

(22) PCT Filed: Apr. 6, 2012

(86) PCT No.: PCT/JP2012/059606
§ 371 (c)(1),
(2), (4) Date: Oct. 25, 2013

(87) PCT Pub. No.: WO2012/137959
PCT Pub. Date: Oct. 11, 2012

(65) Prior Publication Data
US 2014/0051241 A1 Feb. 20, 2014

(30) Foreign Application Priority Data
Apr. 6, 2011 (JP) .................................. 2011-084493

(51) Int. Cl.
*H01L 21/28* (2006.01)
*H01L 21/3205* (2006.01)
(Continued)

(52) U.S. Cl.
CPC ........ *H01L 21/0485* (2013.01); *H01L 29/1608* (2013.01); *H01L 29/45* (2013.01); *H01L 29/47* (2013.01); *H01L 29/6606* (2013.01); *H01L 29/872* (2013.01)

(58) Field of Classification Search
CPC ................................................ H01L 21/0485
USPC ........................................................ 438/602
See application file for complete search history.

(56) References Cited

U.S. PATENT DOCUMENTS 6,139,624 A * 10/2000 Rupp ................................ 117/2
6,410,460 B1 6/2002 Shalish et al.
(Continued)

FOREIGN PATENT DOCUMENTS

JP H11-503568 A 3/1999
JP 2006-332357 A 12/2006
(Continued)

OTHER PUBLICATIONS

Krishna Shenai et al., "Optimum Semiconductors for High-Power Electronics" IEEE Transactions on Electron Devices, vol. 36. No. 9, p. 1811-1823, Sep. 1989.
(Continued)

*Primary Examiner* — Matthew Landau
*Assistant Examiner* — Igwe U Anya
(74) *Attorney, Agent, or Firm* — Rabin & Berdo, P.C.

(57) ABSTRACT

A surface of a silicon carbide substrate on which a graphite layer is formed is covered with a metal layer which can form carbide. Then, the silicon carbide substrate is annealed to cause reaction between a metal in the metal layer which can form carbide and carbon in the graphite layer so as to change the graphite layer between the metal layer which can form carbide and the silicon carbide substrate to a metal carbide layer. Thus, the graphite layer is removed. The adhesion between the metal layer which can form carbide and the silicon carbide substrate can be improved so that separation of the metal layer which can form carbide can be suppressed. Graphite deposits can be suppressed due to the removal of the graphite layer so that separation of a wiring metal film formed on a surface of the metal layer which can form carbide can be suppressed.

15 Claims, 6 Drawing Sheets

(51) Int. Cl.
  *H01L 21/04*  (2006.01)
  *H01L 29/16*  (2006.01)
  *H01L 29/45*  (2006.01)
  *H01L 29/47*  (2006.01)
  *H01L 29/66*  (2006.01)
  *H01L 29/872* (2006.01)

(56) References Cited

U.S. PATENT DOCUMENTS

| | | | |
|---|---|---|---|
| 6,759,683 B1 * | 7/2004 | Cole et al. | 257/77 |
| 6,815,323 B1 * | 11/2004 | Lu et al. | 438/602 |
| 7,297,626 B1 * | 11/2007 | Cole et al. | 438/602 |
| 2006/0270225 A1 | 11/2006 | Kawai et al. | |
| 2006/0273323 A1 * | 12/2006 | Yamamoto et al. | 257/77 |
| 2007/0138482 A1 | 6/2007 | Tanimoto | |
| 2011/0233560 A1 * | 9/2011 | Koike et al. | 257/77 |
| 2012/0126250 A1 * | 5/2012 | Tamaso | 257/77 |

FOREIGN PATENT DOCUMENTS

| | | |
|---|---|---|
| JP | 2006-332358 A | 12/2006 |
| JP | 2006-344688 A | 12/2006 |
| JP | 2007-184571 A | 7/2007 |
| JP | 2009-010096 A | 1/2009 |

OTHER PUBLICATIONS

Japanese Office Action dated Jan. 6, 2015 and its partial English translation.

* cited by examiner

METHOD FOR MANUFACTURING SILICON CARBIDE SEMICONDUCTOR DEVICE

TECHNICAL FIELD

The present invention relates to a method for manufacturing a silicon carbide semiconductor device, by which method the adhesion between the silicon carbide semiconductor device and a metal deposited film is improved.

BACKGROUND ART

Silicon carbide (SiC) is a material that is very stable chemically. The band gap of silicon carbide is 3 eV, which is wide enough to be extremely stably used as a semiconductor even at high temperature. In addition, because the breakdown strength of silicon carbide is also larger than that of silicon (Si) by one digit or more, attention has been paid to silicon carbide as a material alternative to silicon, whose performance limit is close to that of silicon carbide, in view of a power semiconductor device (for example, see K. Shenai and other two persons, Optimum Semiconductors for High-Power Electronics, IEEE Transactions on Electron Devices, September 1989, Vol. 36, No. 9, pp. 1811-1823).

In the last stage of processing, a wiring metal film for connecting an external device is formed in a semiconductor device. Requisite items for the wiring metal film include lots of items such as small contact resistance, non-separation at the time of dicing, and prevention of separation due to durability against long term use after bonding or die-bonding. Among these items, particularly the prevention of separation is requisite so that intensive adhesion is requisite. This is not exceptional for the case where an electrode structure of a silicon carbide semiconductor device is formed.

In a silicon carbide semiconductor device which is made of silicon carbide, silicon carbide contains carbon (C) and high temperature treatment is often used in the process of producing (manufacturing) the silicon carbide semiconductor device. For this reason, a graphite layer is apt to be formed on a surface of a silicon carbide substrate constituting the silicon carbide semiconductor device. When a metal film used for wiring etc. is deposited on the surface of the silicon carbide substrate on which the graphite layer has been generated, the metal film is apt to be separated from the silicon carbide substrate.

Particularly, when attention is paid to the step of forming an ohmic electrode serving as low resistive connection in a silicon carbide semiconductor device, it is reported that the step may be performed in such a manner that an nickel (Ni) film is deposited on a silicon carbide substrate and then subjected to heat treatment to make nickel in the Ni film and silicon in the silicon carbide substrate react with each other to thereby form, for example, an Ni silicide film on the silicon carbide substrate. However, in the case where the Ni silicide film is formed, Ni hardly reacts with carbon. Therefore, silicon in the silicon carbide substrate reacts with Ni so that carbon (hereinafter referred to as remaining carbon) whose bonding to silicon is cut off forms a graphite layer on the Ni silicide film. When a wiring metal film for making connection with an external device is formed on the graphite layer, adhesive force between the silicon carbide substrate and the wiring metal film is lowered, thereby resulting in separation of the wiring metal film.

Therefore, as a method for suppressing separation of the wiring metal film, there have been proposed a method for removing the graphite layer in a plasma process in an inert gas (argon (Ar) etc.) atmosphere, a method for forming an Ni silicide film on the Ni film before heat treatment on the Ni film to thereby prevent graphite from being deposited in the topmost surface (for example, see JP-A-2006-332358), and a method for removing deposited graphite in such a manner that a metal layer which can react with carbon is deposited on the graphite layer and then subjected to heat treatment (for example, see JP-A-2006-344688).

SUMMARY OF INVENTION

Technical Problem

However, there are lots of causes of formation of the graphite layer which brings about separation of the wiring metal film in the process of manufacturing a silicon carbide semiconductor device.

When the graphite layer which may cause the separation is removed by a physical method such as Ar sputtering, not only the graphite layer but also the Ni silicide film for providing low resistive connection are removed. For this reason, the method for removing only the graphite layer accurately by a physical method is complicated in terms of processing.

On the other hand, when deposited graphite is removed in such a manner that a metal layer which can react with carbon is deposited and subjected to heat treatment, the processing can be simplified but a large number of steps are performed from formation of an Ni silicide film to formation of a wiring metal film. For this reason, there is a fear that a graphite layer may be deposited on a surface used for formation of the wiring metal film to thereby bring about separation of the wiring metal film due to various causes in the process for these steps.

In order to solve the foregoing problems inherent in the background art, an object of the invention is to provide a method for manufacturing a silicon carbide semiconductor device, by which method the adhesion between a metal film and a silicon carbide device can be improved and separation of the metal film can be suppressed.

Solution to Problem

In order to solve the foregoing problems and achieve the object of the invention, the method for manufacturing a silicon carbide semiconductor device according to the invention is a method for manufacturing a silicon carbide semiconductor device in which an electrode structure is formed on a silicon carbide substrate, the method being characterized as follows.

First, a first step is performed to cover a surface of the silicon carbide substrate on which a graphite layer is generated, with a metal layer which can form carbide. Then, a second step is performed to make carbon in the graphite layer and a metal in the metal layer react with each other by annealing so as to change the graphite layer between the metal layer and the silicon carbide substrate to a carbide layer. A metal silicide film is formed in advance as the electrode structure on the surface of the silicon carbide semiconductor, and a surface of the metal silicide film on which the graphite layer is generated is covered with the metal layer by the first step.

In addition, in the aforementioned invention, the method for manufacturing a silicon carbide semiconductor device according to the invention is characterized in that: the second step is performed after a wiring metal film is formed as the electrode structure on a surface of the metal layer.

In addition, in the aforementioned invention, the method for manufacturing a silicon carbide semiconductor device according to the invention is characterized in that : the metal layer contains titanium as a main component.

In addition, in the aforementioned invention, the method for manufacturing a silicon carbide semiconductor device according to the invention is characterized in that: the metal silicide film is a nickel silicide film.

In addition, in the aforementioned invention, the method for manufacturing a silicon carbide semiconductor device according to the invention is characterized in that: the annealing on the silicon carbide substrate is performed at a temperature not lower than 500K.

In addition, in the aforementioned invention, the method for manufacturing a silicon carbide semiconductor device according to the invention is characterized in that: the annealing on the silicon carbide substrate is performed in a vacuum atmosphere.

According to the aforementioned invention, when a graphite layer is generated on a surface of a silicon carbide substrate or a surface of a metal silicide film formed on the silicon carbide substrate, the graphite layer and a metal layer which is deposited on a surface of the graphite layer and which can form carbide are annealed at higher temperature than room temperature so as to be reacted with each other so that the graphite layer is changed to a carbide layer and removed.

Due to the removal of the graphite layer, adhesive force between the silicon carbide substrate or the metal silicide film and the metal layer which can form carbide can be improved. Further, because the graphite layer is changed to the carbide layer, graphite is not deposited on the metal layer which can form carbide. Therefore, separation of a wiring metal film formed on the metal layer which can form carbide can be suppressed. Accordingly, even when any wiring metal film is formed on the metal layer which can form carbide, an effect of the invention can be obtained so that a metal forming the wiring metal film can be desirably selected for producing a silicon carbide semiconductor device.

Advantageous Effects of Invention

The method for manufacturing a silicon carbide semiconductor device according to the invention can obtain an effect that the adhesion between a metal film and a silicon carbide device can be improved and separation of the metal film can be suppressed.

DESCRIPTION OF EMBODIMENTS

Preferred embodiments of a method for manufacturing a silicon carbide semiconductor device according to the invention will be described below in detail with reference to the accompanying drawings. Incidentally, in the following description of the embodiments and the accompanying drawings, similar constituents are referred to by the same signs and redundant description thereof will be omitted.

(Principal of Invention)
(First Embodiment)

Figure 1:
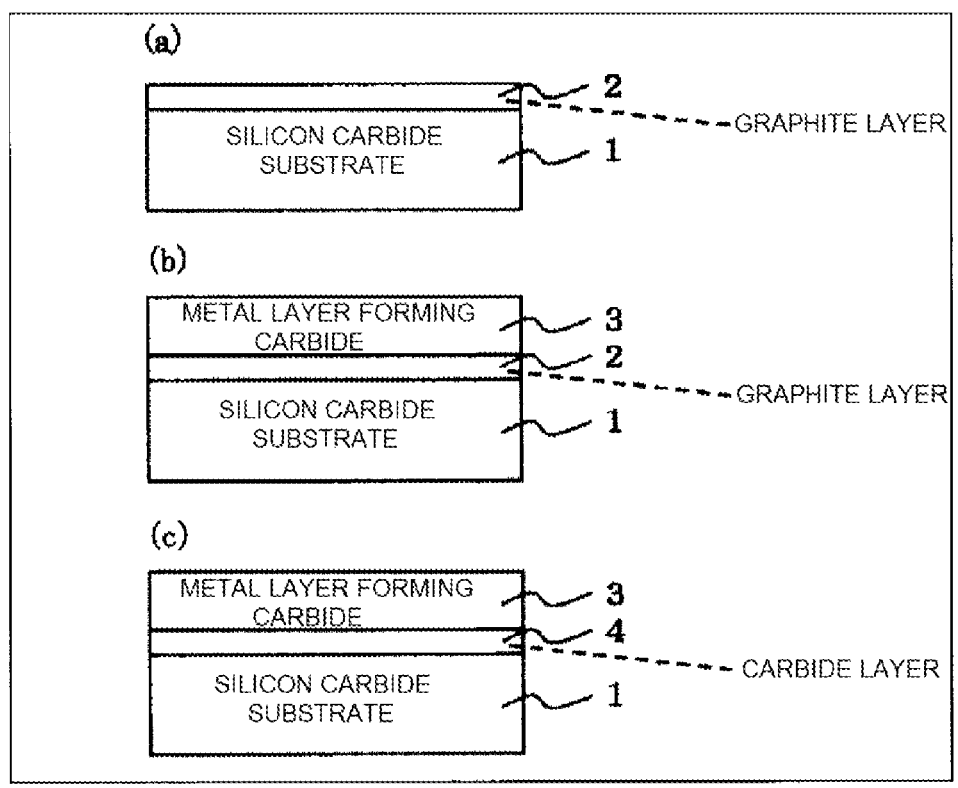
FIG. 1 is a sectional view showing states where a silicon carbide semiconductor substrate is being manufactured according to a first embodiment of the invention.

A method for manufacturing a silicon carbide semiconductor substrate according to a first embodiment of the invention will be described. FIG. 1 is a sectional view showing states where a silicon carbide semiconductor substrate is being manufactured according to the first embodiment of the invention. A bonding state between a graphite layer generated on a silicon carbide (SiC) substrate and a metal layer which can form carbide is shown in FIG. 1. The silicon carbide substrate 1 is a constituent portion of a silicon carbide semiconductor device which is produced (manufactured) by the method for manufacturing a silicon carbide semiconductor device according to the invention. Although not shown, a device structure of a device (hereinafter referred to as silicon carbide device) is formed on the silicon carbide substrate 1 by a general method (hereinafter the same rule will also apply to FIGS. 2 to 6).

A wiring metal film (not shown) constituting a surface electrode such as an SBD (Schottky Barrier Diode) or an MOSFET (Metal Oxide Semiconductor Field Effect Transistor) is formed on a surface of the silicon carbide substrate 1 by a general method. When this wiring metal film is formed, the following processing is performed in the condition that a graphite layer 2 has been generated on the surface of the silicon carbide substrate 1 as shown in (a) of FIG. 1. Thus, an effect of the invention can be obtained.

In the case where the graphite layer 2 has been formed on the surface of the silicon carbide substrate 1 as shown in (a) of FIG. 1, a metal layer 3 (which is expressed as a metal layer forming carbide in FIG. 1. The same rule will hereinafter apply to FIGS. 2 and 3) is deposited on a surface of the graphite layer 2, as shown in (b) of FIG. 1. The metal layer 3 which can form carbide contains a metal which can form carbide, as a main component. The metal which can form carbide means a metal which can form carbide as a product of chemical reaction (irreversible reaction) with carbon (C) in the silicon carbide substrate 1 or carbon in the graphite layer 2 generated in the process of producing (manufacturing) the silicon carbide semiconductor device. Specifically, the metal which can form carbide is, for example, titanium (Ti).

When the silicon carbide substrate 1 is then annealed, for example, at higher temperature than room temperature after deposition of the metal layer 3 which can form carbide is completed, carbon in the graphite layer 2 which may cause separation of the wiring metal film and a metal in the metal layer 3 which can form carbide are reacted with each other. By this reaction, the graphite layer 2 is changed to a metal carbide layer 4 so that the metal carbide layer 4 is formed between the silicon carbide substrate 1 and the metal layer 3 which can form carbide, as shown in (c) of FIG. 1. The room temperature means a state in which the temperature inside the annealing oven is neither heated nor cooled. For example, the room temperature is about 25° C.

When the metal carbide layer 4 is formed thus, the graphite layer 2 between the silicon carbide substrate 1 and the metal layer 3 which can form carbide can be removed. Therefore, the adhesion between the silicon carbide substrate 1 and the metal layer 3 which can form carbide is improved. In this manner, separation of the metal layer 3 which can form carbide can be suppressed. In addition, when the metal carbide layer 4 is formed thus, only the graphite layer 2 can be removed accurately so that the process can be simplified. Accordingly, the cause of deposition of graphite on a surface of the metal layer 3 which can form carbide can be reduced.

The metal layer 3 which can form carbide preferably contains a metal which can form carbide, with a ratio high enough to form the metal carbide layer 4 so as to prevent carbon from remaining at least in the graphite layer 2. It is because that the metal carbide layer 4 can be formed to prevent the graphite layer 2 from staying behind between the silicon carbide substrate 1 and the metal layer 3 which can form carbide.

In addition, annealing for reaction between the carbon in the graphite layer 2 and the metal in the metal layer 3 which can form carbide is preferably performed after deposition of the metal layer 3 which can form carbide is completed. The reason is as follows. Even in the case where annealing is performed during deposition of the metal layer 3 which can form carbide, the metal in the metal layer 3 which can form carbide reacts with the carbon in the graphite layer 2 so that the metal carbide layer 4 can be formed. However, the coefficient of thermal expansion of the metal contained in the metal layer 3 which can form carbide is different from the coefficient of thermal expansion of the silicon carbide substrate 1. Therefore, when the temperature after the annealing is reduced, the metal layer 3 which can form carbide is contracted more largely than the silicon carbide substrate 1 (or hardly contracted in comparison with the silicon carbide) so that stress is applied to the silicon carbide substrate 1 to thereby lower the adhesive force between the metal layer 3 which can form carbide and the silicon carbide substrate 1.

(Second Embodiment)

Figure 2:
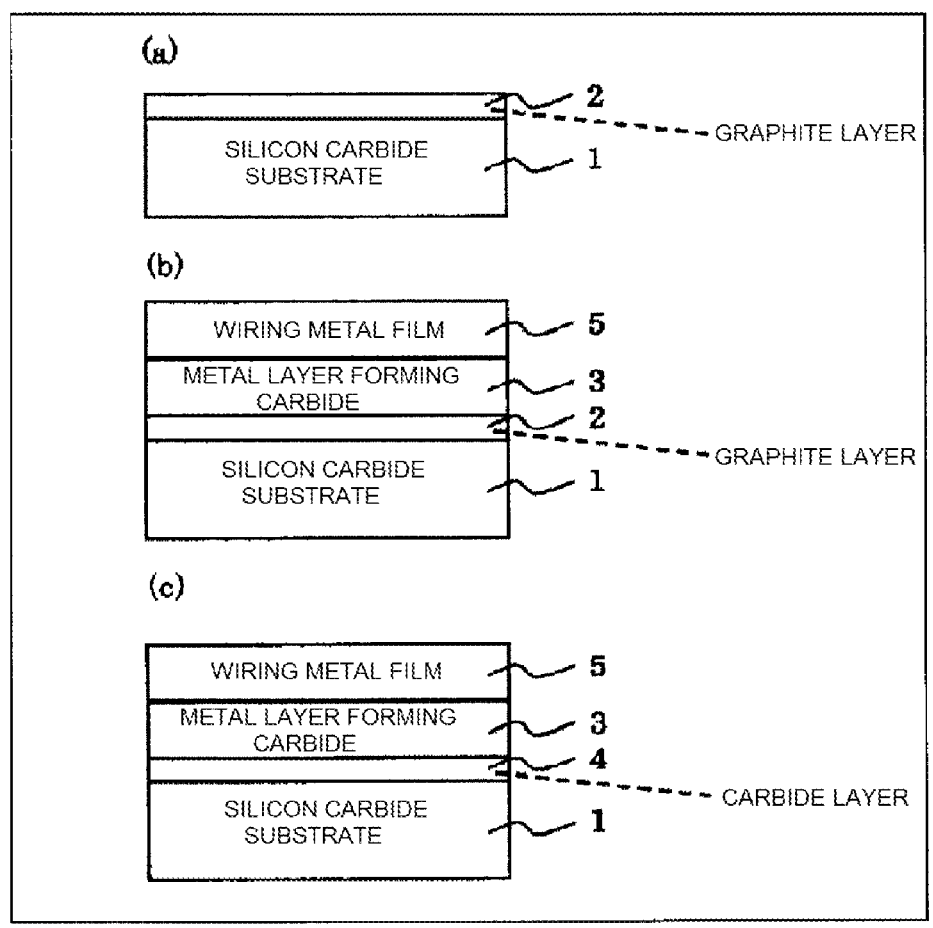
FIG. 2 is a sectional view showing states where a silicon carbide semiconductor substrate is being manufactured according to a second embodiment of the invention.

Next, a method for manufacturing a silicon carbide semiconductor substrate according to a second embodiment of the invention will be described. FIG. 2 is a sectional view showing states where a silicon carbide semiconductor substrate is being manufactured according to the second embodiment of the invention. A bonding state among a graphite layer generated on the silicon carbide substrate, a metal layer which can form carbide and a wiring metal film is shown in FIG. 2.

In the case where the graphite layer 2 has been formed on a surface of the silicon carbide substrate 1 as shown in (a) of FIG. 2, the metal layer 3 which can form carbide is deposited and successively a single layer or a plurality of layers of a desired metal are deposited as a wiring metal film 5 as shown in (b) of FIG. 2. When the metal layer 3 which can form carbide is deposited on a surface of the graphite layer 2, a metal carbide layer 4 is formed in a subsequent annealing step as described above but graphite is not deposited in an interface between the metal layer 3 which can form carbide and the wiring metal film 5. Therefore, adhesive force between the metal layer 3 which can form carbide and the wiring metal film 5 is ensured.

When the silicon carbide substrate 1 is then annealed at higher temperature than room temperature after deposition of the wiring metal film 5 is completed, carbon in the graphite layer 2 which may cause separation of the wiring metal film 5 and a metal in the metal layer 3 which can form carbide are reacted with each other. By this reaction, the graphite layer 2 is changed to the metal carbide layer 4 so that the metal carbide layer 4 is formed between the silicon carbide substrate 1 and the metal layer 3 which can form carbide, as shown in (c) of FIG. 2. In this manner, the adhesion between the silicon carbide substrate 1 and the metal layer 3 which can form carbide is improved in the same manner as that in the first embodiment.

In addition, the carbon in the graphite layer 2 reacts with the metal in the metal layer 3 which can form carbide to thereby form the metal carbide layer 4 so that the carbon does not stay behind alone. Therefore, graphite is not deposited in an interface between the metal layer 3 which can form carbide and the wiring metal film 5. For this reason, it may not be appropriate to select a metal which can suppress the adhesion to the silicon carbide device (the silicon carbide substrate on which a device structure is formed) from being lowered due to graphite, as the material forming the wiring metal film 5. Accordingly, the metal forming the wiring metal film can be desirably selected for manufacturing a silicon carbide semiconductor device and separation of the wiring metal film 5 can be suppressed.

(Third Embodiment)

Figure 3:
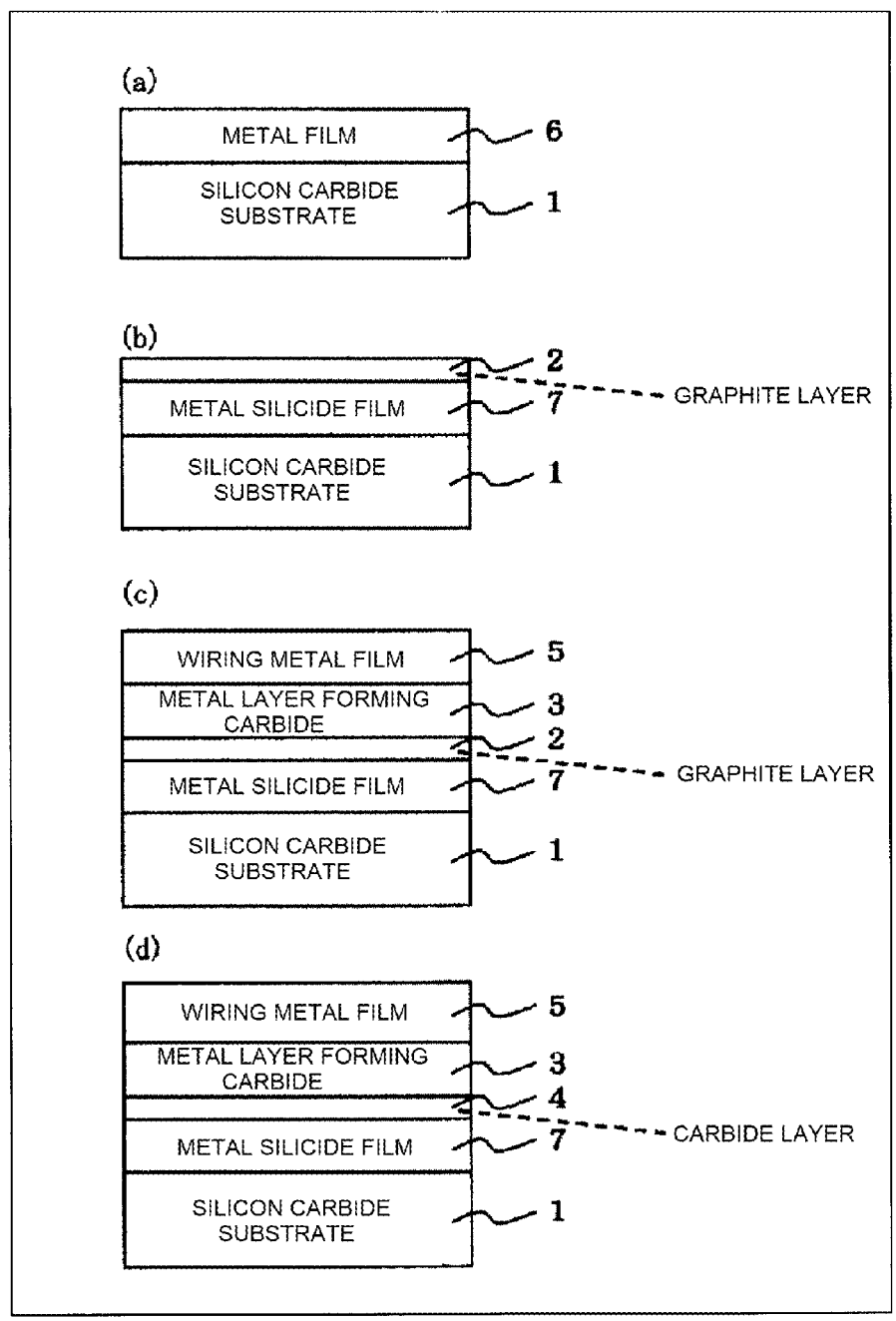
FIG. 3 is a sectional view showing states where a silicon carbide semiconductor substrate is being manufactured according to a third embodiment of the invention.

Next, a method for manufacturing a silicon carbide semiconductor substrate according to a third embodiment of the invention will be described. FIG. 3 is a sectional view showing states where a silicon carbide semiconductor substrate is being manufactured according the third embodiment of the invention. A bonding state among a graphite layer which is generated on a metal silicide film when the metal silicide film is formed on the silicon carbide substrate, a metal layer which can form carbide and a wiring metal film is shown in FIG. 3.

When a metal film 6 for forming an ohmic electrode is deposited on a surface of the silicon carbide substrate 1 as shown in (a) of FIG. 3 and then annealed, silicon in the silicon carbide substrate 1 and a metal in the metal film 6 react with each other in an interface between the silicon carbide substrate 1 and the metal film 6 so that the metal film 6 changes to metal silicide. When the metal film 6 is thin in thickness, the metal film 6 changes to a mixture layer 7 (indicated as metal silicide film in FIG. 3) containing at least two selected from the group consisting of metal silicide, metal carbide and graphite so that a graphite layer 2 is formed easily on a surface of the mixture layer 7, as shown in (b) of FIG. 3. Particularly, when, for example, nickel (Ni) etc. hardly reacting with carbon is deposited as the metal film 6, the aforementioned problem appears conspicuously.

Therefore, when the metal layer 3 which can form carbide is deposited on a surface of the graphite layer 2 as shown in (c) of FIG. 3 and then annealed, the graphite layer 2 can be removed in the same manner as in the first embodiment and the second embodiment. Specifically, the metal layer 3 which can form carbide is deposited on the surface of the mixture layer 7 on which the graphite layer 2 has been generated, and successively a single layer or a plurality of layers of a desired metal are deposited as a wiring metal film 5 on a surface of the metal layer 3 which can form carbide. Further, after deposition of the wiring metal film 5 is completed, the silicon carbide substrate 1 on which the mixture layer 7, the metal layer 3 which can form carbide and the wiring metal film 5 have been deposited is annealed at higher temperature than room temperature, as shown in (d) of FIG. 3.

By this annealing, the graphite layer 2 between the metal layer 3 which can form carbide and the mixture layer 7 changes to a metal carbide layer 4. In this manner, the graphite layer 2 which may cause separation of the metal layer 3 which can form carbide can be eliminated so that graphite can be prevented from being deposited in an interface between the metal layer 3 which can form carbide and the wiring metal film 5. Therefore, separation of the metal layer 3 which can form carbide and the wiring metal film 5 can be suppressed. Accordingly, even when the metal film 6 for forming an ohmic electrode is deposited on the surface of the silicon carbide substrate 1 and the wiring metal film 5 is formed on the surface of the metal film 6, the same effect as in the first embodiment and the second embodiment can be obtained.

In addition, deposition of the respective metal films on the silicon carbide substrate 1 is normally performed, for example, in a vacuum. Therefore, when annealing successively performed after the metal layer 3 which can form carbide is deposited or after the wiring metal film 5 is further successively deposited is also performed in a vacuum, a metal in the metal layer 3 which can form carbide can be prevented from reacting with oxygen or nitrogen in the air. In this manner, carbon in the graphite layer 2 can be prevented from remaining without reacting with the metal in the metal layer 3 which can form carbide. Accordingly, the effect of the invention can be further improved.

FIRST EXAMPLE

Figure 4:
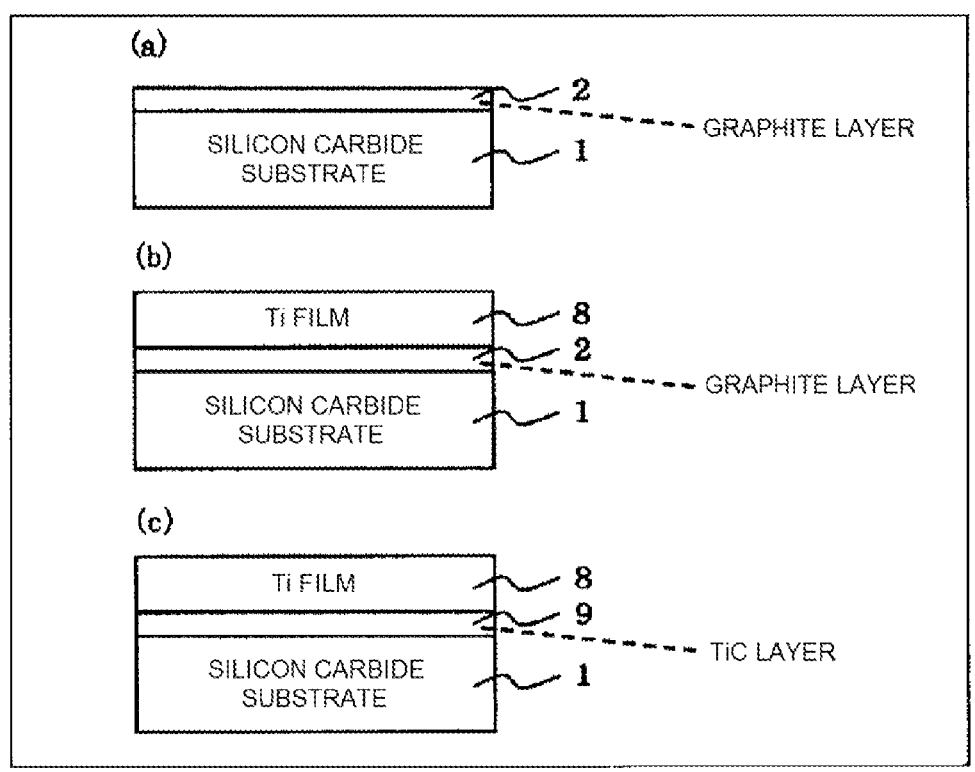
FIG. 4 is a sectional view showing states where a silicon carbide semiconductor substrate is being manufactured according to a first example of the invention.

Next, a method for manufacturing a silicon carbide semiconductor device according to a first example will be described in detail in accordance with the first embodiment. FIG. 4 is a sectional view showing states where a silicon carbide semiconductor device is being manufactured according to the first example of the invention. A bonding state between a silicon carbide substrate 1 and a Ti film 8 when the Ti film 8 is formed as a metal layer which can form carbide is shown in FIG. 4.

First, a silicon carbide substrate 1, for example, made of 4H—SiC is prepared, as shown in (a) of FIG. 4. The silicon carbide substrate 1 may be entirely made of silicon carbide, or of the silicon carbide substrate 1, only a first main surface side to which the method for manufacturing a silicon carbide semiconductor device according to the invention is applied may be made of silicon carbide. In addition, a desired structure, for example, a device such as an SBD may be formed on a second main surface of the silicon carbide substrate 1 opposite to the first main surface to which the method for manufacturing a silicon carbide semiconductor device according to the invention is applied. A graphite layer 2 is deposited on the first main surface of the silicon carbide substrate 1.

The graphite layer 2 is deposited on the surface of the silicon carbide substrate 1, for example, during a large number of steps performed for producing a silicon carbide semiconductor device. The graphite layer 2 stays behind on the whole of the surface of the silicon carbide substrate 1 uniformly or on a part of the surface of the silicon carbide substrate 1, at the time of formation of an electrode metal film. The graphite layer 2 cannot be removed completely but stays behind on the surface of the silicon carbide substrate 1 for the reason that a removal step such as etching cannot be performed, for example, immediately before the electrode metal film is formed on the first main surface of the silicon carbide substrate 1 after a device structure such as an SBD or an MOSFT is formed on the second main surface of the silicon carbide substrate 1.

Therefore, a Ti film 8 is formed, for example, with a thickness of 100 nm, on the first main surface of the silicon carbide substrate 1 on which the graphite layer 2 has been generated, in a vacuum, for example, by use of a physical vapor deposition (PVD) device, as shown in (b) of FIG. 4. When an electrode metal film will be formed only on a part of the first main surface of the silicon carbide substrate 1 on this occasion, the Ti film 8 may be patterned so that the Ti film 8 stays behind only on the part where the electrode metal film will be formed.

After vapor deposition of the Ti film 8, or preferably, for example, immediately after vapor deposition of the Ti film 8, heat treatment at high temperature, which is preferably a temperature not lower than 500K (kelvin) (223° C.), is then performed in a vacuum on the silicon carbide substrate 1 on which the Ti film 8 has been formed. Thus, Ti in the Ti film 8 reacts with carbon in the graphite layer 2 so that the graphite layer 2 between the silicon carbide substrate 1 and the Ti film 8 changes to a titanium carbide (TiC) layer 9, as shown in (c) of FIG. 4. Thus, the graphite layer 2 which may cause separation of the Ti film 8 is removed.

On this occasion, respective layers in an interface between the silicon carbide substrate 1 and the TiC layer 9 and an interface between the TiC layer 9 and the Ti film 8 are chemically bonded with each other. Therefore, the respective layers from the silicon carbide substrate 1 to the Ti film 8 are bonded with one another with high adhesive strength.

In this manner, the graphite layer 2 put between the silicon carbide substrate 1 and the Ti film 8 is changed to the TiC layer 9 by a series of steps of forming the Ti film 8 on the surface of the silicon carbide substrate 1 and performing annealing thereon. Accordingly, the graphite layer 2 does not have to be removed by a physical method etc. with complicated steps before the wiring metal film is formed, but only the graphite layer 2 which may cause separation of the Ti film 8 can be removed accurately. In this manner, separation of the Ti film 8 can be prevented. In addition, when high temperature heat treatment is performed after the Ti film 8 is entirely vapor-deposited on the surface of the silicon carbide substrate 1, stress which may be generated due to difference in coefficient of thermal expansion between the silicon carbide substrate 1 and the Ti film 8 is not applied so that adhesive force between the silicon carbide substrate 1 and the Ti film 8 is increased.

SECOND EXAMPLE

Figure 5:
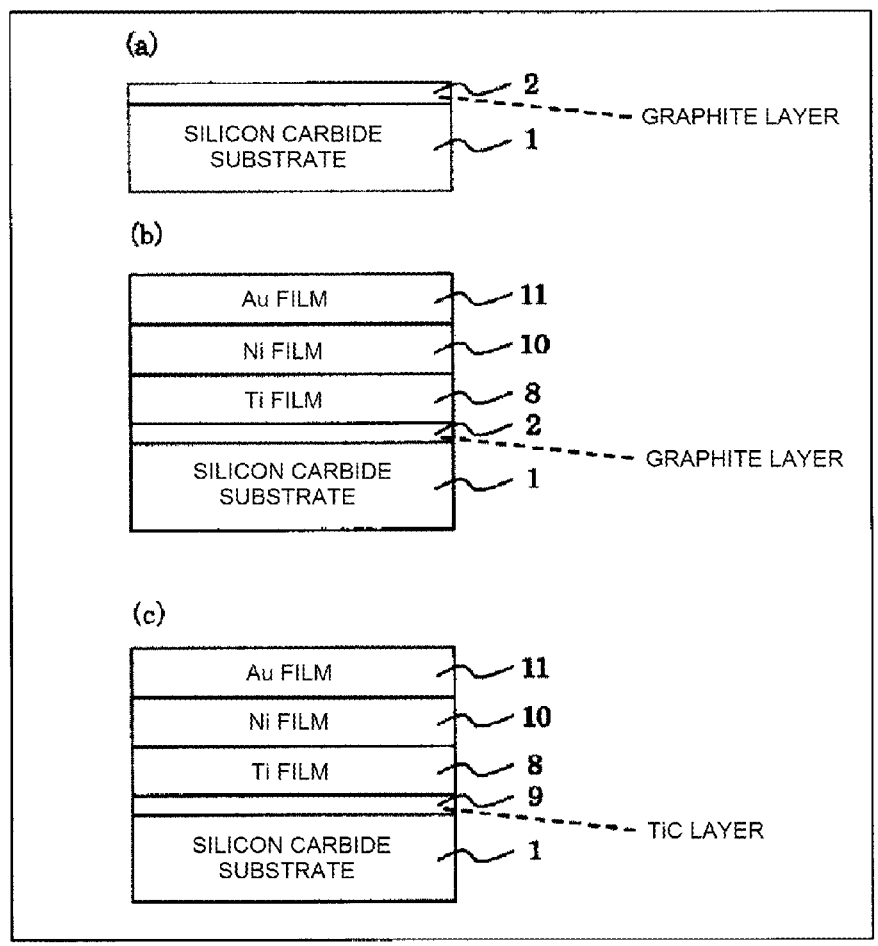
FIG. 5 is a sectional view showing states where a silicon carbide semiconductor substrate is being manufactured according to a second example of the invention.

Next, a method for manufacturing a silicon carbide semiconductor device according to a second example will be described in detail in accordance with the second embodiment. FIG. 5 is a sectional view showing states where a silicon carbide semiconductor device is being manufactured according to the second example of the invention. A bonding state among a silicon carbide substrate 1, a Ti film 8, an Ni film 10 and a gold (Au) film 11 when the Ti film 8 is formed as a metal layer which can form carbide and the Ni film 10 and the Au film 11 are stacked as wiring metal films in this sequence is shown in FIG. 5.

First, a silicon carbide substrate 1 which is, for example, made of 4H—SiC and on a first main surface of which a graphite layer 2 has been deposited is prepared by respective steps for producing the silicon carbide semiconductor device in the same manner as in the first example, as shown in (a) of FIG. 5.

Next, a Ti film 8 is formed, for example, with a thickness of 100 nm on the first main surface of the silicon carbide substrate 1 on which the graphite layer 2 has been formed, in a vacuum, for example, by use of a physical vapor deposition device, as shown in (b) of FIG. 5. Successively, an Ni film 10 is formed, for example, with a thickness of 500 nm on a surface of the Ti film 8, and further, an Au film 11 is formed, for example, with a thickness of 200 nm on a surface of the Ni film 10. When an electrode metal film will be formed only on a part of the first main surface of the silicon carbide substrate 1 on this occasion, the Ti film 8 may be patterned so that the Ti film 8 stays behind only on the part where the electrode metal film will be formed.

After vapor deposition of the Ti film 8, the Ni film 10 and the Au film 11 in this sequence, or preferably, for example, immediately after the vapor deposition, heat treatment at high temperature, which is preferably a temperature not lower than 500K (223° C.), is then performed in a vacuum on the silicon carbide substrate 1 on which these metal films have been formed. In this manner, Ti in the Ti film 8 reacts with carbon in the graphite layer 2 so that the graphite layer 2 between the silicon carbide substrate 1 and the Ti film 8 changes to a TiC layer 9, as shown in (c) of FIG. 5. Thus, the graphite layer 2 which may cause separation of the Ti film 8 is removed.

On this occasion, respective layers in an interface between the silicon carbide substrate 1 and the TiC layer 9 and an interface between the TiC layer 9 and the Ti film 8 are chemically bonded with each other. In addition, when these metal films are vapor-deposited successively in a vacuum, adhesive forces between the respective metal films in an interface between the Ti film 8 and the Ni film 10 and an interface between the Ni film 10 and the Au film 11 becomes high enough to prevent the respective metal films from being separated from each other. Therefore, the respective layers from the silicon carbide substrate 1 to the Au film 11 are bonded with one another with high adhesive strength.

Thus, the graphite layer 2 put between the silicon carbide substrate 1 and the Ti film 8 is changed to the TiC layer 9 by a series of wiring metal film forming steps of forming the Ti film 8, the Ni film 10 and the Au film 11 on the surface of the silicon carbide substrate 1 and performing annealing thereon so that graphite is prevented from being deposited between the respective metal films. Accordingly, the graphite layer 2 does not have to be removed before the wiring metal films are formed by a physical method etc. with complicated steps, but the graphite layer 2 can be removed simply by performing the wiring metal film forming steps and deposits of the graphite can be prevented. In this manner, separation of the Ti film 8, the Ni film 10 and the Au film 11 can be prevented.

Although steps after that are not shown, the Au film 11 which is not oxidized is formed as a wiring metal film in the topmost surface so that solder bonding etc. to a lead frame etc. can be performed smoothly. Thus, a stabilized silicon carbide semiconductor device can be manufactured. In addition, when the Ti film 8, the Ni film 10 and the Au film 11 are completely vapor-deposited on the surface of the silicon carbide substrate 1 and then subjected to high temperature heat treatment, adhesive forces between the respective layers from the silicon carbide substrate 1 to the Au film 11 are increased without being affected by stress generated due to difference in coefficient of thermal expansion among the silicon carbide substrate 1, the TiC layer 9, the Ti film 8, the Ni film 10 and the Au film 11.

THIRD EXAMPLE

Figure 6:
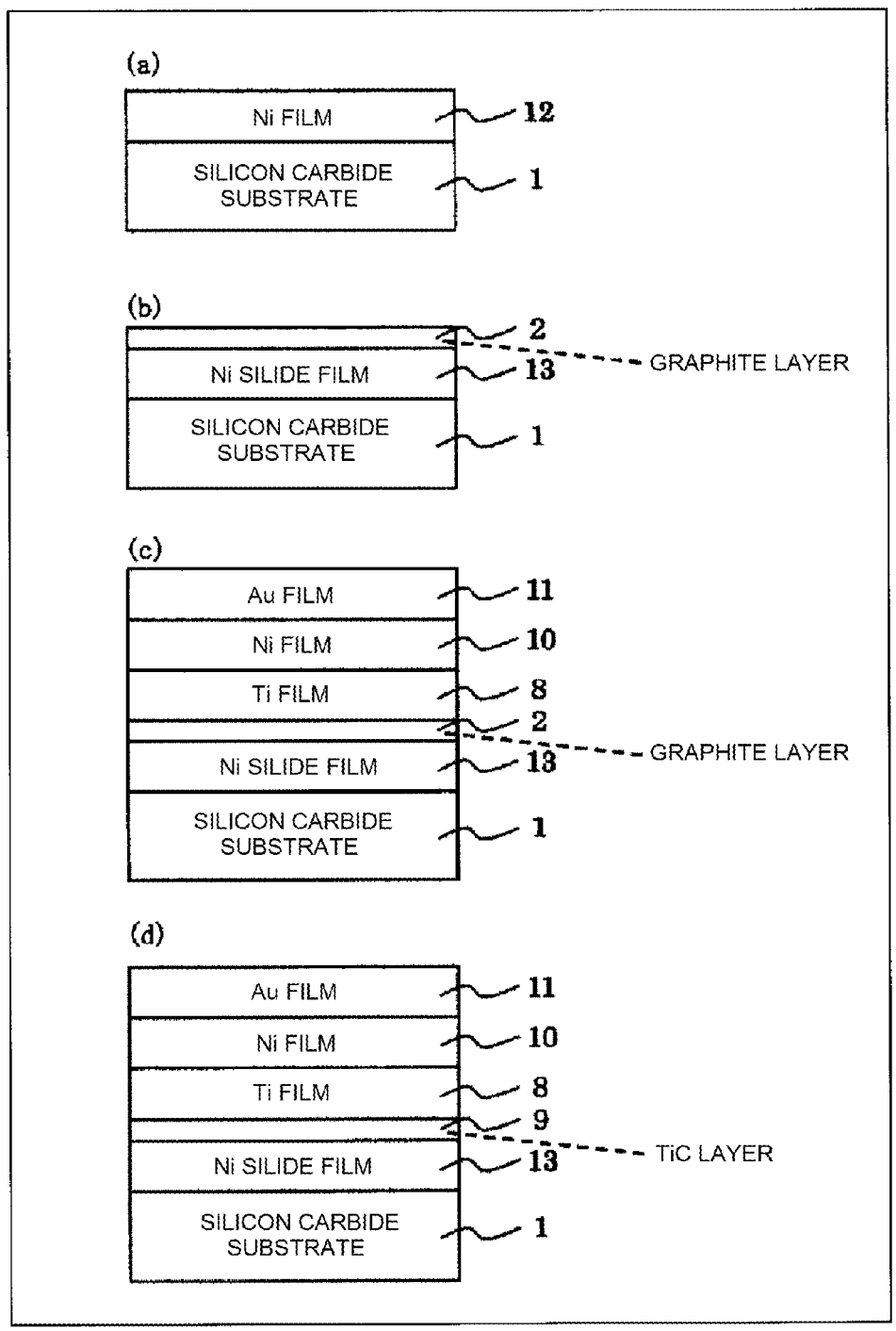
FIG. 6 is a sectional view showing states where a silicon carbide semiconductor substrate is being manufactured according to a third example of the invention.

Next, a method for manufacturing a silicon carbide semiconductor device according to a third example will be described in detail in accordance with the third embodiment. FIG. 6 is a sectional view showing states where a silicon carbide semiconductor device is being manufactured according to the third example of the invention. A bonding state among a silicon carbide substrate 1, an Ni silicide film 13, a Ti film 8, an Ni film 10 and an Au film 11 when the Ni silicide film 13 is formed as a metal silicide film, the Ti film 8 is formed as a metal layer which can form carbide, and the Ni film 10 and the Au film 11 serving as wiring metal films are stacked in this sequence is shown in FIG. 6.

First, a silicon carbide substrate 1 which is, for example, made of 4H—SiC is prepared and an Ni film 12 used for an ohmic contact with the silicon carbide substrate 1 is deposited, for example, with a thickness of 50 nm on a first main surface of the silicon carbide substrate 1, as shown in (a) of FIG. 6. On this occasion, when an electrode metal film will be formed in, of the silicon carbide substrate 1, only a part of the first main surface to which the method for manufacturing a silicon carbide semiconductor device according to the invention is applied, the Ni film 12 may be patterned so that the Ni film 12 is deposited only on that part.

Heat treatment for two minutes at a temperature not lower than 300° C., for example, a temperature of 1000° C. is performed by a rapid thermal annealing (RTA) device. In this manner, the Ni film 12 is silicided so that an Ni silicide film 13 serving as a low resistive ohmic contact is formed on the surface of the silicon carbide substrate 1 as shown in (b) of FIG. 6. However, because Ni very hardly reacts with carbon, a graphite layer 2 is formed on the Ni silicide film 13 by carbon remaining in the silicon carbide substrate 1. Any other material such as graphite may be mixed even inside the Ni silicide film 13.

Next, when, for example, a vertical SBD which is not shown is manufactured on a second main surface of the silicon carbide substrate 1, the silicon carbide substrate 1 goes through a large number of steps in order to form a device structure such as a Schottky contact on the second main surface of the silicon carbide substrate 1. Accordingly, in the process of going through the large number of steps, the silicon carbide substrate 1 is contaminated, for example, by residue etc. of a resist, so that graphite is formed on the surface of the silicon carbide substrate 1. Therefore, even when the graphite layer 2 originally existing on a surface of the Ni silicide film 13 serving as a low resistive ohmic contact has been removed before the wiring metal films are formed, another graphite layer 2 which brings about separation of the wiring metal films is formed again immediately before the wiring metal films are formed.

Therefore, the graphite layer 2 is not removed by a physical method etc. with complicated steps before the wiring metal films are formed. In the condition that the graphite layer 2 remains formed on the surface of the Ni silicide film 13, the wiring metal film forming steps are performed as follows. Specifically, the Ti film 8 is formed, for example, with a thickness of 100 nm on the surface of the Ni silicide film 13 on which the graphite layer 2 has been formed, in a vacuum, for example, by a physical vapor deposition device, as shown in (c) of FIG. 6. Further, successively, the Ni film 10 is formed, for example, with a thickness of 500 nm on a surface of the Ti film 8, and the Au film 11 is formed, for example, with a thickness of 200 nm on a surface of the Ni film 10, in a vacuum, for example, by the same vapor deposition device as that for the formation of the Ti film 8.

Next, for example, immediately after vapor deposition of the Ti film 8, the Ni film 10 and the Au film 11, heat treatment at high temperature, which is preferably a temperature not lower than 500K (223° C.), is performed in a vacuum on the silicon carbide substrate 1 on which the Ti film 8, the Ni film 10 and the Au film 11 have been formed. In this manner, Ti in the Ti film 8 and carbon in the graphite layer 2 react with each other so that the graphite layer 2 between the Ni silicide film 13 and the Ti film 8 changes to a TiC layer 9, as shown in (d) of FIG. 6. In this manner, the graphite layer 2 which may cause separation of the Ti film 8 is removed.

On this occasion, the respective layers in an interface between the silicon carbide substrate 1 and the Ni silicide film 13, an interface between the Ni silicide film 13 and the TiC layer 9 and an interface between the TiC layer 9 and the Ti film 8 are chemically bonded with each other. In addition, adhesive forces between the respective metal films in an interface between the Ti film 8 and the Ni film 10 and an interface between the Ni film 10 and the Au film 11 are enhanced satisfactorily because the respective metal films are vapor-deposited successively in a vacuum. Therefore, the respective layers from the silicon carbide substrate 1 to the Au film 11 are bonded with each other with high adhesive strength.

In this manner, by a series of ohmic electrode and wiring metal film forming steps of forming the Ni silicide film 13, the Ti film 8, the Ni film 10 and the Au film 11 on the surface of the silicon carbide substrate 1 and annealing thereon, the graphite layer 2 put between the Ni silicide film 13 and the Ti film 8 is changed to the TiC layer 9. Accordingly, the graphite layer 2 does not have to be removed before the wiring metal films are formed by a physical method etc. with complicated steps, but the graphite layer 2 can be removed simply by performing the ohmic electrode and wiring metal film forming steps. Thus, deposits of the graphite can be prevented, so that separation of the Ti film 8, the Ni film 10 and the Au film 11 can be prevented.

Although steps after that are not shown, the Au film 11 which is not oxidized is formed as a wiring metal film in the topmost surface so that solder bonding etc. to a lead frame etc. can be performed smoothly. Thus, a stabilized silicon carbide semiconductor device can be manufactured. In addition, when the Ti film 8, the Ni film 10 and the Au film 11 are completely vapor-deposited and then subjected to high temperature heat treatment, adhesive force is increased without being affected by stress generated due to difference in coefficient of thermal expansion among the silicon carbide substrate 1, the Ni silicide film 13, the TiC layer 9, the Ti film 8, the Ni film 10, and the Au film 11.

The invention is not limited to the aforementioned embodiments and examples. Various changes of design can be made on the invention without departing from the gist of the invention. Specifically, the embodiments have been described in the case where an electrode is formed with a uniform thickness on the whole of a main surface of a silicon carbide substrate by way of example. However, the invention can be applied to, for example, a contact electrode etc. of an MPS (Merged PiN and Schottky Barrier) structure diode in which an electrode is formed partially on a main surface of a silicon carbide substrate. In addition, although description has been made by way of example in the case in which a device structure is not provided in a second main surface opposite to a first main surface of a silicon carbide substrate to which the method for manufacturing a silicon carbide semiconductor device according to the invention is applied, the invention can be applied to, for example, a Schottky electrode etc. of a vertical SBD provided with a device structure in a second main surface of a silicon carbide substrate.

Industrial Applicability

As described above, the method for manufacturing a silicon carbide semiconductor device according to the invention is useful for a silicon carbide semiconductor device provided with an electrode in contact with a silicon carbide substrate.

The invention claimed is:

1. A method for manufacturing a silicon carbide semiconductor device in which an electrode structure is formed on a silicon carbide substrate, the method comprising:
   forming a metal film comprised of a first metal on a surface of the silicon carbide substrate;
   annealing the silicon carbide substrate on which the metal film has been formed to change the metal film into a metal silicide film, a graphite layer being formed on the metal silicide film as a result of the forming the metal silicide film;
   forming a metal layer comprised of a second metal on the graphite layer; and
   performing a further annealing to the silicon carbide substrate on which the metal layer has been formed to thereby change the graphite layer into a carbide layer, and to thereby eliminate the graphite layer.

2. The method for manufacturing a silicon carbide semiconductor device according to claim 1, further comprising:
   forming a wiring metal film as the electrode structure on a surface of the metal layer before performing the further annealing.

3. The method for manufacturing a silicon carbide semiconductor device according to claim 2, wherein the further annealing to the silicon carbide substrate on which the metal layer has been formed is performed in a vacuum atmosphere.

4. The method for manufacturing a silicon carbide semiconductor device according to claim 1, wherein the metal layer contains titanium as a main component.

5. The method for manufacturing a silicon carbide semiconductor device according to claim 4, wherein the further annealing to the silicon carbide substrate on which the metal layer has been formed is performed in a vacuum atmosphere.

6. The method for manufacturing a silicon carbide semiconductor device according to claim 1, wherein the metal silicide film is a nickel silicide film.

7. The method for manufacturing a silicon carbide semiconductor device according to claim 6, wherein the further annealing to the silicon carbide substrate on which the metal layer has been formed is performed in a vacuum atmosphere.

8. The method for manufacturing a silicon carbide semiconductor device according to claim 1, wherein the further annealing to the silicon carbide substrate on which the metal layer has been formed is performed at a temperature that is not lower than 500 K.

9. The method for manufacturing a silicon carbide semiconductor device according to claim 8, wherein the further annealing to the silicon carbide substrate on which the metal layer has been formed is performed in a vacuum atmosphere.

10. The method for manufacturing a silicon carbide semiconductor device according to claim 1, wherein the further annealing to the silicon carbide substrate on which the metal layer has been formed is performed in a vacuum atmosphere.

11. The method for manufacturing a silicon carbide semiconductor device according to claim 1, wherein the metal layer contains enough of the second metal to change all carbon in the graphite layer to carbide.

12. The method for manufacturing a silicon carbide semiconductor device according to claim 1, wherein the metal film forms an ohmic electrode.

13. The method for manufacturing a silicon carbide semiconductor device according to claim 1, wherein the metal film formed on the silicon carbide substrate is changed into a mixed layer comprised of any two of silicide, carbide and graphite, and the graphite layer is formed on the mixed layer.

14. The method for manufacturing a silicon carbide semiconductor device according to claim 1, wherein the first metal is a different metal from the second metal.

15. The method for manufacturing a silicon carbide semiconductor device according to claim 14, wherein the first metal is titanium, and the second metal is nickel.

* * * * *